United States Patent [19]

Eichelberger et al.

[11] 4,180,807

[45] Dec. 25, 1979

[54] CHARGE TRANSFER CIRCUIT WITH VOLTAGE THRESHOLD COMPENSATING MEANS

[75] Inventors: Charles W. Eichelberger, Schenectady; Walter J. Butler, Scotia, both of N.Y.

[73] Assignee: General Electric Company, Schenectady, N.Y.

[21] Appl. No.: 852,234

[22] Filed: Nov. 17, 1977

[51] Int. Cl.² .......................................... H03K 13/20
[52] U.S. Cl. ........................ 340/347 AD; 307/221 C; 307/221 D; 357/24; 340/347 M; 340/347 NT
[58] Field of Search .... 340/347 AD, 347 M, 347 NT; 357/24; 307/221 C, 221 D

[56] References Cited

PUBLICATIONS

Bernadotte et al., Bucket Brigade Devices Arranged for Dividing Analog—IBM Technical Disclosure Bulletin, vol. 18, No. 8, 1/1976, p. 2540.

*Primary Examiner*—Thomas J. Sloyan
*Attorney, Agent, or Firm*—Geoffrey H. Krauss; Joseph T. Cohen; Marvin Snyder

[57] ABSTRACT

A charge transfer circuit of the type including first and second capacitors separated by a charge transfer MOSFET is disclosed. The disclosure includes the description of a circuit which compensates for variations in the threshold voltage of the charge transfer MOSFET such that the magnitude of the charge packet transferred from the first to the second capacitor is substantially independent of changes in the magnitude of the threshold voltage.

5 Claims, 3 Drawing Figures

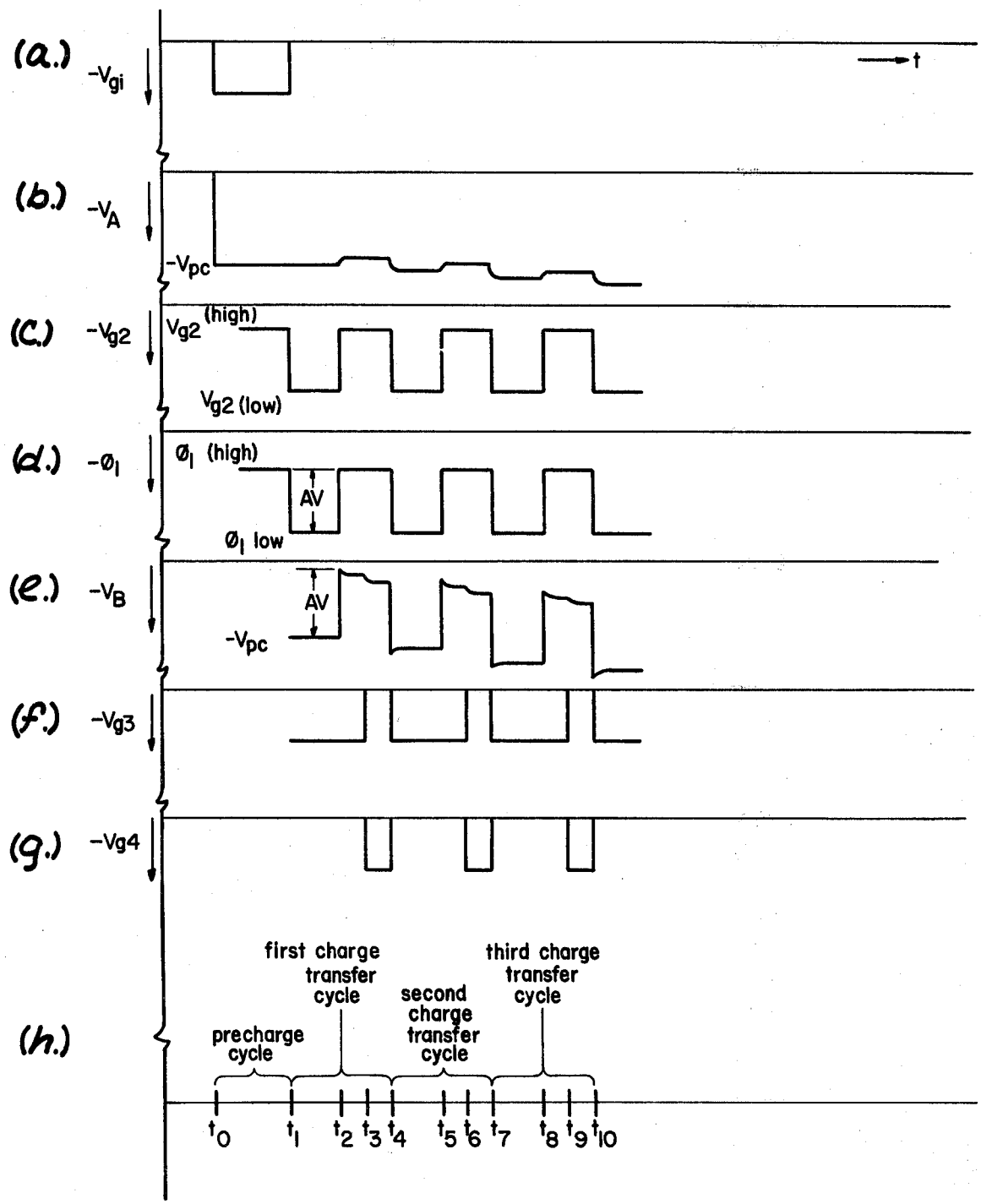

CHARGE TRANSFER CIRCUIT WITH VOLTAGE THRESHOLD COMPENSATING MEANS

BACKGROUND OF THE INVENTION

The present invention is related to charge transfer circuits of the type comprising first and second charge storage capacitors and a charge transfer transistor for transferring a plurality of discrete packets of charge from the first to the second charge storage capacitor. Charge transfer circuits of the foregoing type are particularly useful in monolithic analog to digital converters such as those described in U.S. Pat. application Ser. No. 628,542, filed Nov. 3, 1975, now abandoned and replaced by application Ser. No. 853,115, filed Nov. 21, 1977 U.S. Pat. No. 4,145,689, and assigned to the assignee of the present application. Exemplary of several applications of such circuits is U.S. Pat. No. 3,819,954 which discloses a charge transfer delay line circuit.

While the uses of charge transfer circuits are varied, a common requirement of charge transfer analog to digital converters is that an equal amount of charge be transferred to the second charge storage capacitor during each charge transfer operation. This requirement is especially crucial in uses involving analog to digital converters which rely on an accurate count of the number of metered charge packets required to change the charge stored in the second charge storage capacitor from a first to a second level.

In applications of the latter type, a MOSFET transistor is operated in the "shelf" transistor mode so as to transfer a metered charge packet, whose magnitude is a function of the gate voltage of the MOSFET less its threshold voltage from the first to the second capacitor. To obtain proper results, the magnitude of the charge packet transferred by the MOSFET is ideally constant. In actual practice, however, the size of the charge packets varies, for example, as a function of both a thermally induced leakage current in the semi-conductor substrate in which the first and second capacitors and the charge transfer transistors are preferably formed and variations in the magnitude of the threshold voltage of the MOSFET. These latter variations are also a function of temperature.

The prior art has disclosed several circuits which compensate for variations in the magnitude of the charge packets due to changes in the magnitude of the thermally induced leakage current. The present invention is designed to compensate for errors resulting from changes in the magnitude of the threshold voltage.

BRIEF SUMMARY OF THE INVENTION

The charge transfer circuit of the present invention includes a first capacitor and a charge removal circuit for removing a discrete charge packet from the first capacitor during each of the plurality of charge transfer operations. The charge removal circuit includes first and second MOSFETs having similar electrical characteristics. Each MOSFET is sequentially operated in a "shelf" transistor mode of operation in such a manner that the magnitude of charge removed from the first capacitor by the first and second MOSFETs varies from a constant value as a function of the difference between the threshold voltages of the first and second MOSFETs.

BRIEF DESCRIPTION OF THE DRAWINGS

For the purpose of illustrating the invention, there is shown in the drawings several embodiments which are presently preferred; it being understood, however, that this invention is not limited to the precise arrangements and instrumentalities shown.

FIG. 3 is a series of graphs illustrating various voltages in the circuit of FIG. 1.

DETAILED DESCRIPTION OF THE INVENTION

Figure 1:
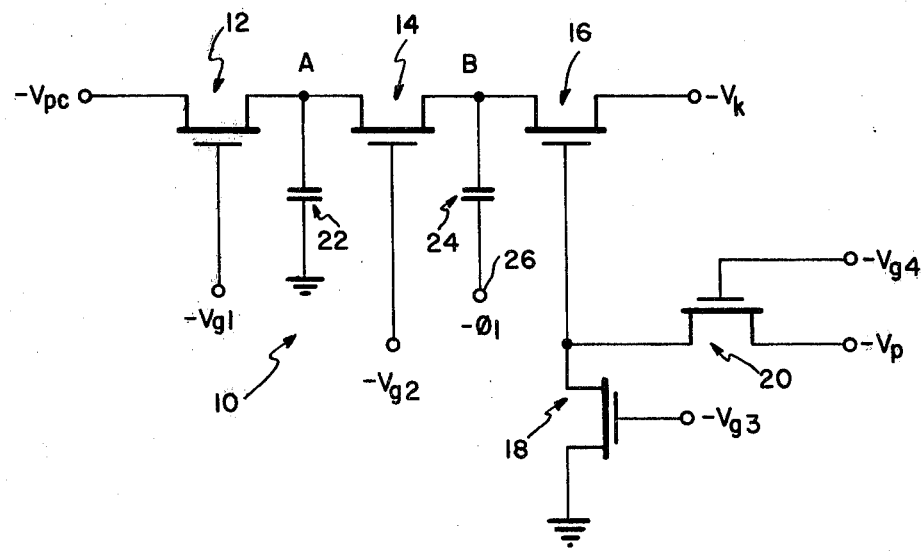
FIG. 1 is a circuit diagram of a charge transfer circuit constructed in accordance with the principles of the present invention.

Referring now to the drawings, where like numerals indicate like elements, there is shown in FIG. 1 a charge transfer circuit constructed in accordance with the principles of the present invention and designated generally as 10. Charge transfer circuit 10 comprises a pre-charge transistor 12, charge transfer transistors 14 and 16, switching transistors 18 and 20 and capacitors 22 and 24. Transistors 12 through 20 are preferably p-channel MOSFETs. Capacitors 22 and 24 and transistors 12 through 20 are all preferably formed in the same substrate such that circuit 10 can be formed as a monolithic device. For reasons which will become clear below, the electrical characteristics of transistors 14 and 16 are closely matched.

Pre-charge transistor 12 is biased into a "switching" mode when a negative gating pulse $-V_{gl}$ is applied to its gate input terminal. So gated, transistor 14 applies a pre-charge voltage $-V_{pc}$ to node A. Charge transfer transistor 14 is alternately biased into a "switching" and "shelf" transistor mode as will be described in greater detail below. When in the "switching" mode, transistor 14 acts as a short circuit between modes A and B and equalizes the voltages on the two nodes. Transistor 14 is biased into the "switching" mode of operation whenever its source and drain are at a voltage which is a threshold voltage more positive than the voltage at its gate. In the "shelf" transistor mode, current flows from the source of the transistor to its drain until the voltage at its source reaches a value equal to its gate voltage less its threshold voltage. Transistor 14 operates in a "shelf" mode whenever its source electrode is allowed to float, so that as current flows from the source to the drain, the source voltage becomes sufficiently negative to turn the device off.

Charge transfer transistor 16 is alternately biased off and into a "switching" mode by switching transistors 18 and 20. When in the "switching" mode, node B acts as the source of transistor 16 and charge flows from node B to the constant voltage $-V_k$ at the drain of transistor 16 until the voltage at node B falls to a value equal to the gate voltage less the threshold voltage of transistor 16. The constant voltage $-V_k$ appearing at the drain of transistor 16 is chosen to be at all times more negative than the voltage at node B in order that the drain of transistor 16 will act as a potential well. So biased, transistor 16 only removes charge from node B and never adds charge thereto.

The operation of charge transfer circuit 10 can best be understood with reference to FIGS. 1 and 3. At time $t_o$, a negative going gating pulse $-V_{gl}$ is applied to the gate of transistor 12. As a result, node A charges to the pre-charge voltage $-V_{pc}$ appearing at the source of the transistor 12. See waveforms (a) and (b) of FIG. 3.

At time $t_1$, the gate voltage $-V_{g2}$ of transistor 14 and the biasing voltage $-\phi_1$ applied to node 26 of capacitor 24 are switched from their respective high levels, $-V_{g2}$(high), $-\phi_1$(high), to their respective low levels $-V_{g2}$(low) and $-\phi_1$(low). While the particular high and low voltages of signals $-V_{g2}$ and $-V_1$ will vary for different embodiments of circuit 10, the voltages should be selected such that they bias transistor 14 into the "switching" mode when the voltages are at their respective low levels and bias transistor 14 into the "shelf" transistor mode when they are in their respective high levels. See waveforms (c) and (d) of FIG. 3.

In accordance with the foregoing, transistor 14 is biased into the "switching" mode of operation at time $t_1$, causing the voltage at node B to fall to $-V_{pc}$ volts. At time $t_2$, gate voltage $-V_{g2}$ and biasing voltage $-\phi_1$ switch to their respective high levels biasing transistor 14 into the "shelf" mode. As shown in waveform (d) of FIG. 3, the voltage applied to node 26 jumps in the positive direction by an amount $\Delta V$. Since the voltage across capacitor 24 cannot instantaneously change, the voltage at node B exhibits a similar step increase. See waveform (e) of FIG. 3. The magnitude of $\Delta V$ is chosen to be sufficiently high to drive the voltage at node B to a level which is higher than the voltage at node A. Accordingly, node B acts as the source of transistor 14 and charge flows from node B to node A until the voltage at node B decreases to a value equal to the gate voltage less the threshold voltage of transistor 14. The charge transferred from node B to node A during this portion of the charge transfer cycle is:

$$Q_1 = C[(V_{g2}(\text{high}) - V_{t2}) - (V_{PC} + \Delta V)] \quad (1)$$

wherein $V_{g2}$(high) is the gate voltage applied to transistor 14 at time $t_1$ and $V_{t2}$ is the threshold voltage of transistor 14.

During the foregoing portion of the charge transfer cycle, transistor 18 was gated on and transistor 20 was gated off. See waveforms (f) and (g) of FIG. 3. At time $t_3$, transistor 18 is turned off and transistor 20 is gated on so as to apply $-V_p$ volts to the base of transistor 16. So biased, transistor 16 is driven into a "switching" mode causing charge to flow from node B to the potential well at the drain of transistor 16. Charge will continue to flow from node B until the voltage at node B falls to a level equal to the gate voltage of transistor 16 less its threshold voltage. As a result of the foregoing operation, a discrete charge packet flows from node B to the potential well in accordance with the following equations:

$$Q_2 = C[(V_p - V_{t3}) - (V_{g2}(\text{high}) - V_{t2})] \quad (2)$$

wherein $V_p$ is the gate voltage applied to transistor 16 at time $t_3$ and $V_{t3}$ is the threshold voltage of transistor 16. At time $t_4$ a single charge transfer operation has been completed and a second charge transfer operation begins.

It should be apparent from the foregoing, that two packets of charge (charge packet $Q_1$ and charge packet $Q_2$) are removed from node B during each charge transfer operation. Since the voltage at the drain of transistor 16 is chosen to act as a potential well and since the gates of transistors 14 and 16 are insulated from capacitors 22 and 26, the only source of charge in circuit 10 is capacitor 22 (which has been pre-charged to the level $-V_{pc}$). Accordingly, the total amount of charge removed from circuit 10 during a single charge transfer operation must be removed from capacitor 22. As a result of the foregoing, the total amount $Q_r$ of charge removed from capacitor 22 during a single charge transfer operation is:

$$Q_r = Q_2 = C[(V_{g2}(\text{high}) - V_p) + (V_{t3} - V_{t2})] \quad (3)$$

As clearly shown in equation (3) the size of the charge packet $Q_r$ removed from capacitor 22 is a function of the difference of the threshold voltages $V_{t2}$ and $V_{t3}$. Accordingly, any variations in these quantities will have a relatively small effect upon the size of the total charge packet. Additionally, by closely matching the electrical characteristics of transistors 14 and 16, their threshold voltages are substantially equal. For this reason, equation (3) may, to a first approximation, be reduced to the following equation:

$$Q_r = C[V_{g2}(\text{high}) - V_p] \quad (4)$$

Therefore, the total charge packet removed from capacitor 22 during any charge transfer operation is substantially independent of any change in the magnitude of the threshold voltages of transistors 14 and 16.

Figure 2:
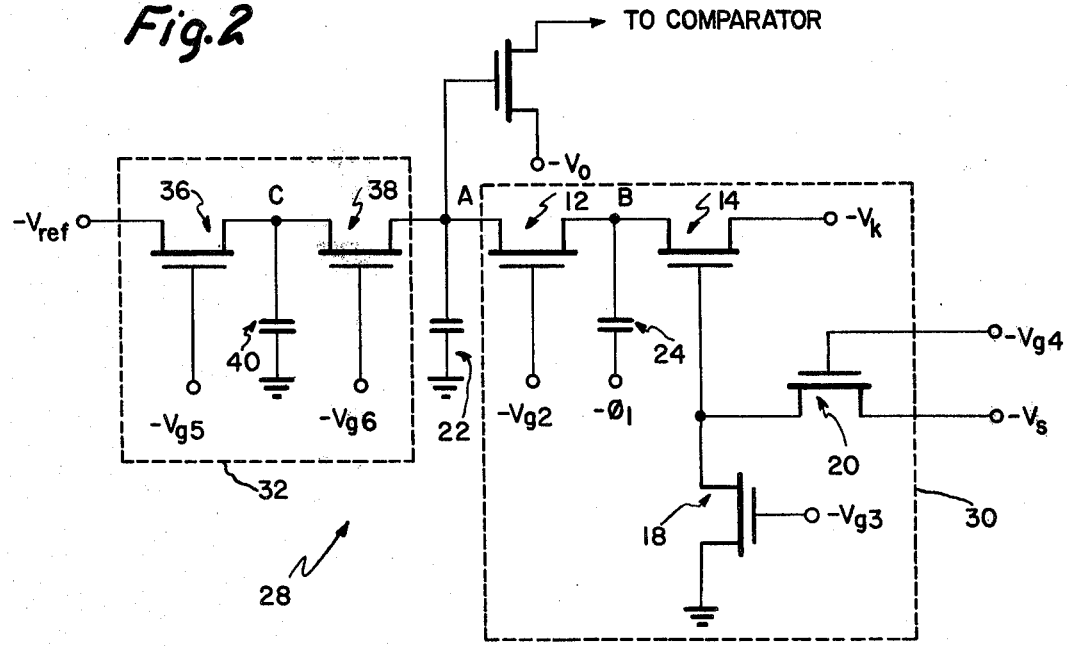
FIG. 2 is a circuit diagram of a portion of an analog to digital converter circuit utilizing the charge transfer circuit of the present invention.

While the foregoing charge transfer circuit 10 has many possible applications, one typical application is illustrated in FIG. 2. FIG. 2 illustrates a portion of an analog to digital converter circuit 28 including a variable charge removal circuit 30, a constant charge supply circuit 32 and a charge storage capacitor 22. A complete analog to digital circuit 28 will also include a comparator, a counter and a control circuit for applying the appropriate biasing voltages to the various elements of the circuit. A complete analog to digital converter of the foregoing type is described in U.S. Pat. application Ser. No. 825,530 filed Aug. 18, 1977 in the name of the present inventors and assigned to the assignee of the present application. The description of the analog to digital converter disclosed therein is expressly incorporated into the present specification. At the initiation of an analog to digital conversion process, node A is pre-charged to the threshold level of the comparator and the count in the counter is cleared. Thereafter, variable charge removal circuit 30 removes a predetermined number of discrete charge packets from capacitor 34, each charge packet having a magnitude proportional to the signal voltage $V_s$ to be converted. It should be noted at this point that it has been assumed that the various MOSFETs of the charge removal circuit 30 are p-channel MOSFETs. Accordingly, negative charge is removed from capacitor 22. It should be recognized, however, that either n-channel or p-channel MOSFETs may be used. For this reason, the charge removed from capacitor 34 will be either positive or negative depending upon the type of MOSFET used. If an n-channel MOSFET is used, a positive charge will be removed from capacitor 22. It should be understood that the term "charge" as used herein refers to either positive or negative charge depending upon the particular type of device used.

From equation (4) above, it can be seen that the voltage across capacitor 22 (assuming p-channel MOSFETs) will decrease by an amount:

$$V_1 = [V_{g2}(\text{high}) - V_p]/K \quad (5)$$

each time charge removal circuit 30 completes another charge transfer operation. In the foregoing equation, $V_p$ is the gate voltage applied to transistor 14 when transistor 20 is gated on and K is the ratio of the capacitance of capacitors 22 and 24. After $N_1$ charge transfer operations, charge removal circuit 30 will have decreased the voltage across capacitor 22 by a total amount $N_1 \Delta V_1$.

After the first integration period has been completed, constant charge supply circuit 32 transfers a plurality of charge packets to capacitor 34. Constant charge supply circuit 32 is a standard bucket brigade circuit of the type well known in the art. Circuits of this type are described in some detail in U.S. Pat. application Ser. No. 825,530 noted above. Briefly, circuits of this type include a first MOSFET transistor 36 biased to operate as a switch and a second MOSFET transistor 38 biased to operate as a "shelf" transistor. During a first clock period, a gating pulse $V_{g5}$ is applied to the gate of transistor 36 applying the constant analog voltage $-V_{ref}$ across capacitor 40. During the next clock period, a gating pulse $-V_{g6}$ is applied to the gate of transistor 38 causing charge to transfer from capacitor 40 to capacitor 22 until the voltage across capacitor 40 decreases to a value equal to the gate voltage of transistor 38 less the threshold voltage thereof. The net effect of this operation is to increase the voltage across capacitor 22 by an amount:

$$V_2 = (V_{g6} - V_{t6} - V_{ref})/K \qquad (6)$$

wherein $V_{t6}$ is the threshold voltage of transistor 38 and K is the ratio of the capacitance of capacitors 22 and 40.

Constant charge supply circuit 32 continues to supply discrete packets of charge to capacitor 34 until the voltage at node A increases to its initial value at which time the comparator generates an output signal indicating the end of the second integration period.

As a result of the foregoing operation of analog to digital converter 28, the charge supplied to capacitor 22 by constant charge supply circuit 32 is equal to the charge removed from capacitor 22 by constant charge removal circuit 30. Stated otherwise:

$$\Delta V_1 N_1 = \Delta V_2 N_2 \qquad (7)$$

Since $N_1$ and $\Delta V_2$ are predetermined constants and since $\Delta V_1$ is proportional to the magnitude of the analog voltage $V_s$ to be converted (see equation 5, supra) the number of charge packets $N_2$ supplied to the capacitor 22 by the constant charge supply circuit 32 is representative of the analog voltage $V_s$ to be converted. Stated otherwise, $$N_2 = (\Delta V_1 N_1 / \Delta V_2) = F(V_s) \qquad (8)$$

As noted in U.S. Pat. application Ser. No. 825,530, a digital counter counts the number of charge packets $N_2$ added to capacitor 34 by constant charge supply means 32 during the second integration period. Accordingly, the count stored in the counter provides the digital representation of the magnitude of the voltage $-V_s$ to be converted.

The present invention may be embodied in other specific forms without departing from the spirit or essential attributes thereof and, accordingly, reference should be made to the appended claims, rather than to the foregoing specification as indicating the scope of the invention.

What is claimed is:

1. A charge transfer circuit, comprising:
   (A) a first capacitor;
   (B) charge removal means for removing a discrete charge packet from said first capacitor during each of a plurality of charge transfer operations, said charge removal means comprising:
   (1) a second capacitor;
   (2) first and second MOSFETs having substantially identical electrical characteristics, said first MOSFET being coupled between said first and second capacitors and said second MOSFET being coupled between said second capacitor and a potential well;
   (3) first biasing means for biasing said first MOSFET into a "shelf" transistor mode of operation during a first portion of each charge transfer operation, said first biasing means biasing said first MOSFET in such a manner that the voltage across said second capacitor defines the source of said first MOSFET and said second capacitor charges to a value which is a function of the gate voltage of said first MOSFET less its threshold voltage; and
   (4) second biasing means for biasing said second MOSFET into a "shelf" mode of operation during the second portion of each charge transfer operation, said first biasing means biasing said second MOSFET in such a manner that the voltage across said second capacitor defines the source of said second MOSFET and said second capacitor charges to a level which is a function of the gate voltage of said second MOSFET less the threshold voltage thereof;
   whereby said first and second MOSFETs cooperate to remove a discrete charge packet from said first capacitor during each said charge transfer operation and the magnitude of said charge packet varies from a constant value as a function of the difference between the threshold voltages of said first and second MOSFETs.

2. The charge transfer circuit of claim 1, wherein said first and second MOSFETs are formed in a single semiconductor substrate.

3. The charge transfer circuit of claim 1, wherein said first biasing means sequentially biases said first MOSFET into a "switching" mode of operation, whereby said second capacitor is charged to a level substantially equal to the charge across said first capacitor, and then biases said first MOSFET into said "shelf" mode of operation during each charge transfer operation.

4. The charge transfer circuit of claim 3, wherein said second biasing means comprises:
   a third MOSFET connected between said gate of said second MOSFET and ground;
   a fourth MOSFET connected between said gate of said second MOSFET and a constant voltage $V_s$;
   means for biasing said third MOSFET into a "switching" mode when said second MOSFET is to operate as a "shelf" transistor and for biasing said fourth MOSFET into a "switching" mode at all other times.

5. An analog to digital converter comprising:
   means comprising a first capacitor for storing charge;
   first charge supply means for supplying a succession of first packets of charge to said charge storage means, said first charge supply means including first and second MOSFETs having substantially similar electrical characteristics; another means comprising a second capacitor for storing charge; said first MOSFET being coupled between said first and second capacitors and said second MOSFET being coupled between said second capacitor and a potential well; and first biasing means for biasing said first MOSFET into a "shelf" transistor mode of operation during a first portion of each of a first one of two integration periods, said first biasing means biasing said first MOSFET in such a manner that the voltage across said second capacitor defines the source of said first MOSFET and said second capacitor charges through a value which is the function of the gate voltage of a first MOSFET less its threshold voltage; and second biasing means for biasing said second MOSFET into a "shelf" mode of operation during a second portion of each of a first of two integration periods, said second biasing means biasing said second MOSFET in such manner that the voltage across said second capacitor defines the sources of said MOSFET and said second capacitor charges to a level which is a function of the gate voltage of said second MOSFET less the threshold voltage thereof, whereby said first and second MOSFETs cooperate to remove a discrete packet of charge from said first capacitor, with the magnitude of said first charge packets varying from a value proportional to the magnitude of an analog signal to be converted as a function of the difference between said threshold voltages of said first and second MOSFETs;

second charge supply means for supplying a succession of second packets of charge to said charge storage means, the magnitude of said second packets of charge being a constant, predetermined value, and the polarity of said second packets of charge being opposite to that of said first packets of charge;

control means for causing said first charge supply means to supply said succession of first packets of charge to said charge storage means during one of two integration periods wherein the charge stored in said charge storage means changes from a first to a second value, said control means also for causing a second charge supply means to supply said charge storage means with said succession of second charge packets during the other of said two integration periods wherein the charge stored in said charge storage means changes from said second to said first value; and means for generating a digital signal which is the function of the ratio between the number of said first charge packets required to change the voltage across said charge storage means from said first to said second value and the number of said second charge packets required to change the voltage across said charge storage means from said second to said first value.

* * * * *